United States Patent
Lee

(10) Patent No.: US 7,771,899 B2
(45) Date of Patent: Aug. 10, 2010

(54) METHOD FOR REPAIRING PHOTOMASK PATTERN DEFECTS

(75) Inventor: Sang Iee Lee, Chungcheongbuk-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 528 days.

(21) Appl. No.: 11/765,907

(22) Filed: Jun. 20, 2007

(65) Prior Publication Data

US 2008/0081299 A1  Apr. 3, 2008

(30) Foreign Application Priority Data

Sep. 29, 2006  (KR) .................... 10-2006-0095712

(51) Int. Cl.
*G03F 1/00*  (2006.01)

(52) U.S. Cl. .......................................... 430/5

(58) Field of Classification Search ............... 430/5, 430/322, 323, 394
See application file for complete search history.

(56) References Cited

U.S. PATENT DOCUMENTS

| 5,811,223 A * | 9/1998 | Bae .......................... 430/312 |
| 6,830,702 B2 * | 12/2004 | Tzu et al. ..................... 216/41 |
| 2004/0142256 A1 | 7/2004 | Best et al. | |

| 2004/0191642 A1 | 9/2004 | Lin | |
| 2006/0093924 A1 | 5/2006 | Adkisson et al. | |
| 2006/0234137 A1 * | 10/2006 | Kim .............................. 430/5 |

FOREIGN PATENT DOCUMENTS

| CN | 1501165 A | 6/2004 |
| CN | 1770008 A | 5/2006 |
| JP | 2-204746 A | 8/1990 |
| JP | 2003-302747 A | 10/2003 |
| KR | 10 1999 0069727 | 6/1998 |
| KR | 10 2003 0001824 A | 1/2001 |
| KR | 10 2001 0030209 A | 4/2001 |
| KR | 10 2004 0055459 A | 6/2004 |

* cited by examiner

*Primary Examiner*—Stephen Rosasco
(74) *Attorney, Agent, or Firm*—Marshall, Gerstein & Borun LLP

(57) ABSTRACT

A method for repairing photomask pattern defects includes patterning a target layer on a transparent substrate, thereby forming first patterns, detecting a defect die including a defect pattern by inspecting the first patterns; forming a mask layer on the transparent substrate, forming a mask pattern that selectively exposes the defect die by performing an exposure process and a development process on the mask layer; etching the target layer of the exposed defect die using the mask pattern as an etching mask to expose the transparent substrate, depositing a target layer on the exposed defect die of the transparent substrate, and patterning the deposited target layer, thereby forming a second pattern on the defect die.

13 Claims, 6 Drawing Sheets

METHOD FOR REPAIRING PHOTOMASK PATTERN DEFECTS

CROSS-REFERENCE TO RELATED APPLICATION

Priority to Korean patent application number 10-2006-0095712, filed on Sep. 29, 2006, the disclosure of which is incorporated by reference in its entirety, is claimed.

BACKGROUND OF THE INVENTION

The invention relates to a method for manufacturing a photomask, and more particularly to a method for repairing photomask pattern defects.

A photolithography process, which is one process for manufacturing semiconductor devices, uses a photomask having a pattern to be transcribed on a wafer. The photomask has circuit and design patterns of the semiconductor devices The circuit and design patterns of the photomask are transcribed on the wafer by an exposure process. In the exposure process and development process performed to manufacture the photomask, particles may be generated and remain on the surface of a light blocking layer formed on the photomask. The particles remaining on the surface of the light blocking layer may cause defects such as a bridge between patterns of the light blocking layer in the subsequent etching process. Such defects may be transcribed on the wafer in the photolithography process, thereby causing a photomask defect and also forming a defect pattern on a semiconductor substrate.

When the defect pattern is formed in a photomask manufacturing process, a process of repairing the defect pattern is performed. However, as the line width of the semiconductor device becomes smaller, defects occur more easily, and it is difficult to completely eliminate pattern defects. Further, the defect pattern can be repaired into a normal pattern by repeating the steps of repairing the defect pattern, cleaning and inspecting. However, if there is a large defect in the defect pattern, the entire photomask is rejected and a new photomask should be reproduced. Thus, a method of completely eliminating the residue defects caused by the particles in the photomask manufacturing process has been studied.

BRIEF SUMMARY OF THE INVENTION

The invention provides a method for repairing photomask pattern defects including: forming first patterns on a transparent substrate; detecting a defect die including a defect pattern by inspecting the first patterns; forming a mask pattern that selectively exposes the defect die on the transparent substrate; removing the defect pattern of the defect die using the mask pattern as an etching mask; forming a material layer for forming a second pattern on the defect die of the transparent substrate; removing the mask pattern; and forming the second pattern on the defect die by patterning the material layer.

BRIEF DESCRIPTION OF THE DRAWINGS

The above and other objects, features, and advantages of the invention will be more clearly understood from the following detailed description taken in conjunction with the accompanying drawings, in which.

DETAILED DESCRIPTION OF THE INVENTION

Preferred embodiments of the invention are described in detail with reference to the accompanying drawings. These embodiments are used only for illustrative purposes, and the invention is not limited thereto.

First, a pattern to be transcribed on a wafer is formed on a mask substrate. Specifically, from bottom to top, a molybdenum silicon nitride (MoSiON) layer, a chromium (Cr) layer and a resist layer are sequentially formed on a transparent quartz substrate. A resist layer pattern is formed by performing an exposure process generally using an electron beam (e-beam) and a development process. The chromium (Cr) layer is etched through an etching mask of the resist layer pattern to form a chromium (Cr) layer pattern, and the resist layer pattern is removed.

A molybdenum silicon nitride (MoSiON) layer pattern is formed by using the chromium (Cr) layer pattern as an etching mask. Meanwhile, align keys may be formed at edges of the mask substrate for exact patterning. The resist layer pattern, the chromium (Cr) layer pattern and the molybdenum silicon nitride (MoSiON) layer pattern can be exactly formed using align keys as a reference point. Although a phase shift mask is used for the photomask In this embodiment, the embodiment of the invent-on may be applied to a binary mask.

When patterning the resist layer, a residue of the resist layer may be formed on the surface of the chromium (Cr) layer, whereby a defect pattern may be generated and a pattern may not be formed due to process abnormalities and the like. Further, a phase shift effect may not be obtained due to a residue of the chromium (Cr) layer formed on the surface of the molybdenum silicon nitride (MoSiON) layer, thereby causing a minimal line width difference and a bridge defect. In order to detect the defect pattern, a die including the defect pattern is detected by a die-to-die inspection method for comparing each die with a corresponding die on the same phase shift mask.

Figure 1:
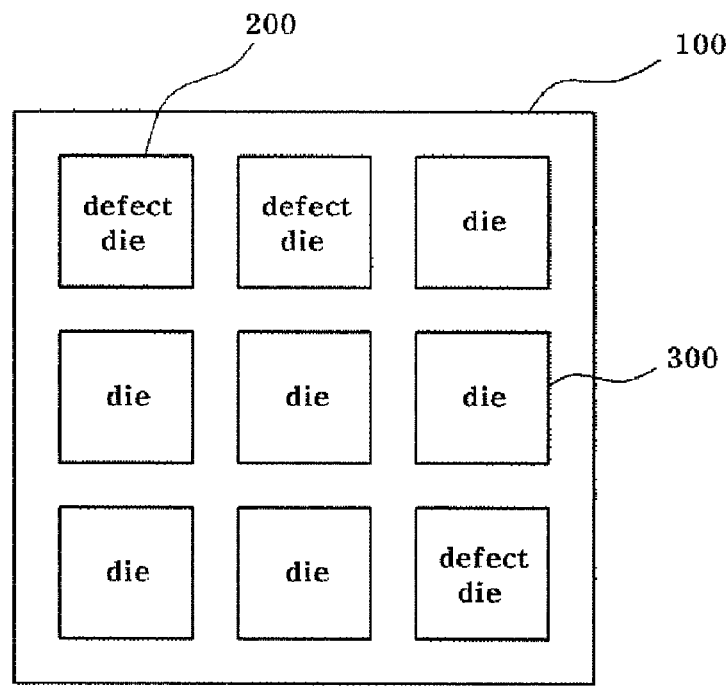
FIGS. 1 to 9 illustrate a method for repairing photomask pattern defects according to the invention.

Referring to FIG. 1, a number of fields are formed on a transparent substrate 100 and each field may include a number of dies. The die including the defect pattern is detected by the die-to-die inspection method for comparing respective dies. Reference numeral 200 denotes defect dies including the defect pattern and reference numeral 300 denotes normal dies which are normally patterned. In this case, patterns formed on the normal dies 300 may be formed by patterning the molybdenum silicon nitride (MoSiON) layer and the chromium (Cr) layer.

Figure 2A:
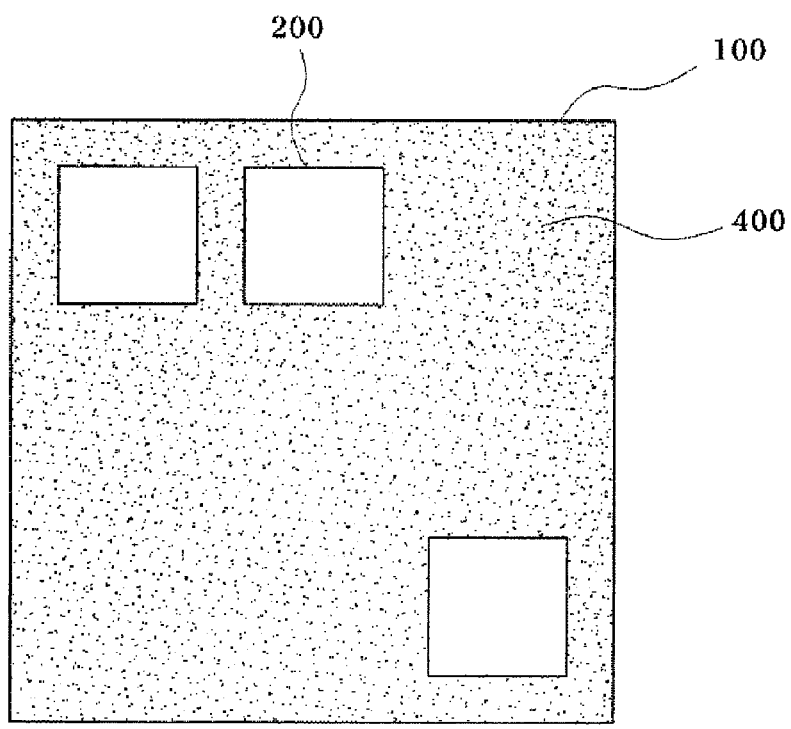
Figure 2B:
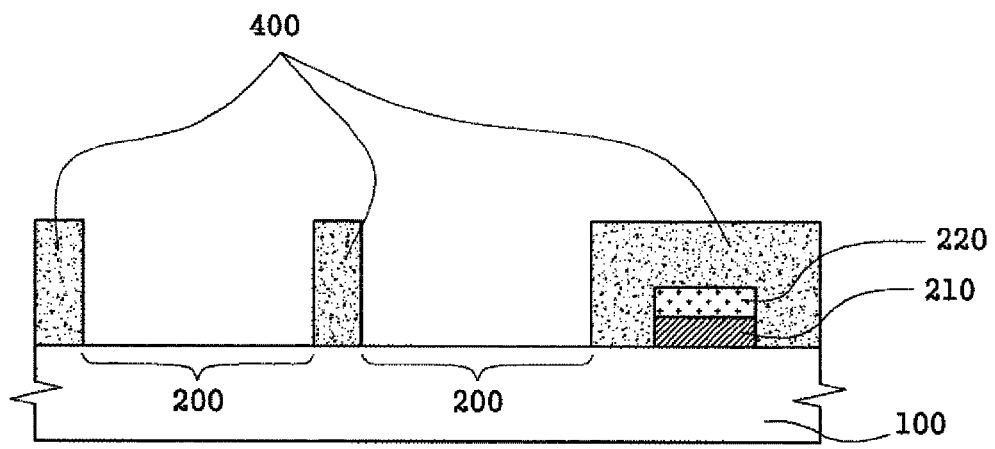

Referring to FIG. 2A, a resist layer 400 is coated on the transparent substrate 100 and then the defect dies 200 are selected. A photolithography process is performed to form a pattern of the resist layer 400 exposing the defect dies 200. The molybdenum silicon nitride (MoSiON) layer and the chromium (Cr) layer patterns formed on the exposed defect dies 200 are etched using the pattern of the resist layer 400 exposing the defect dies 200 as an etching mask. This step is illustrated in FIG. 2B, a cross-section through the top two defect dies 200 of the transparent substrate 100 (see FIG. 2A), shown after the defect dies 200 have been etched. When the defect dies 200 are detected between the normal dies 300, as shown in FIG. 2B, the patterns of the molybdenum silicon nitride (MoSiON) layer 210 and the chromium (Cr) layer 220 formed on the normal dies 300 are protected by the pattern of the resist layer 400 and only the defect dies 200 on the transparent substrate 100 are exposed.

Figure 3:
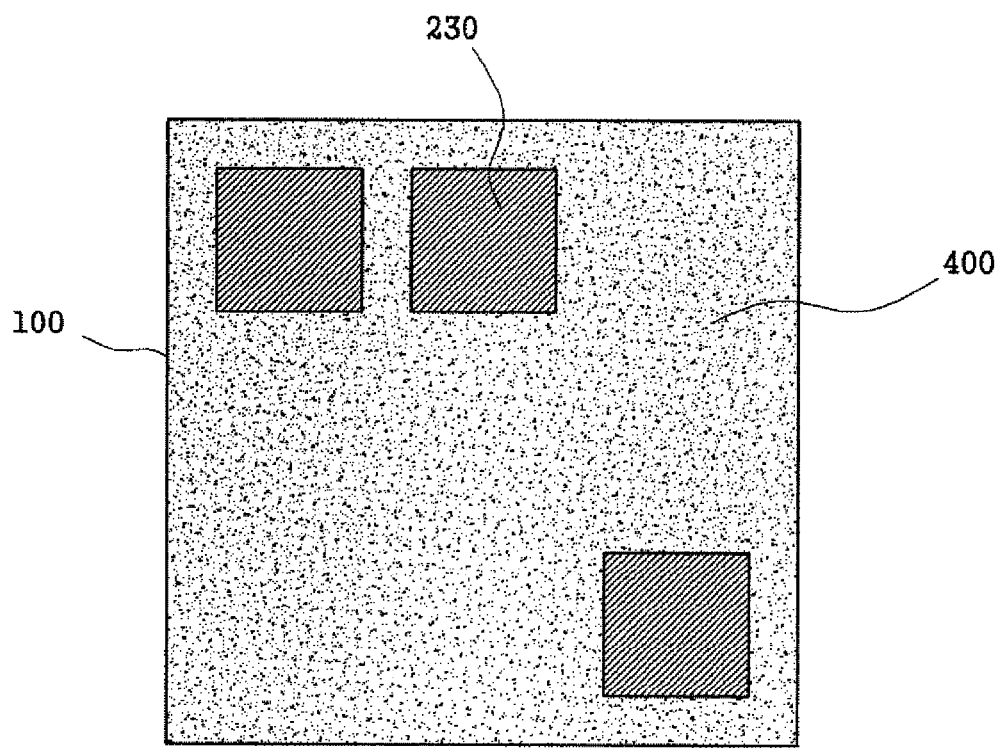
Figure 4A:
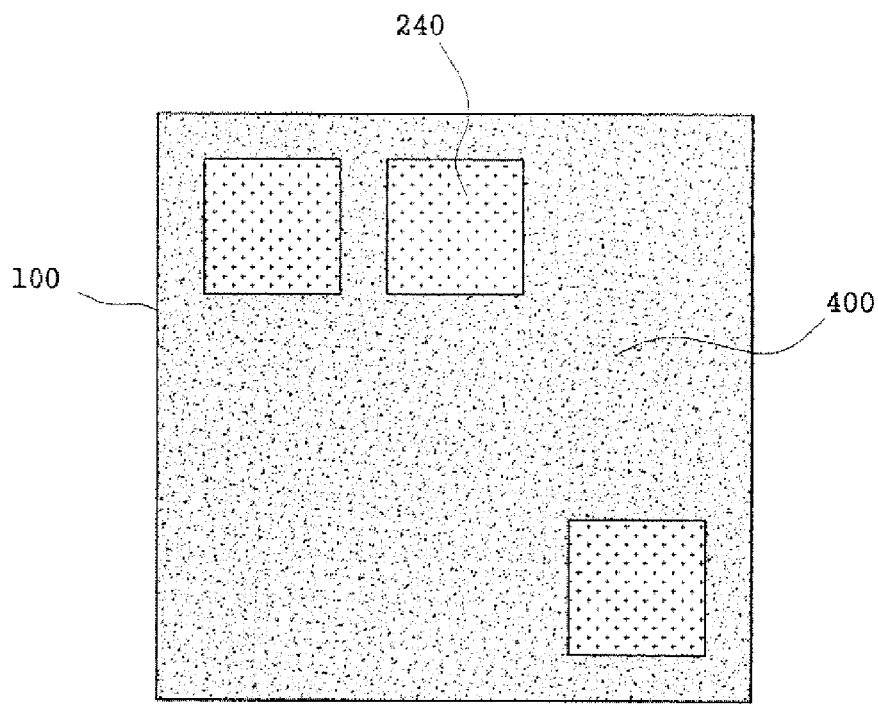
Figure 4B:
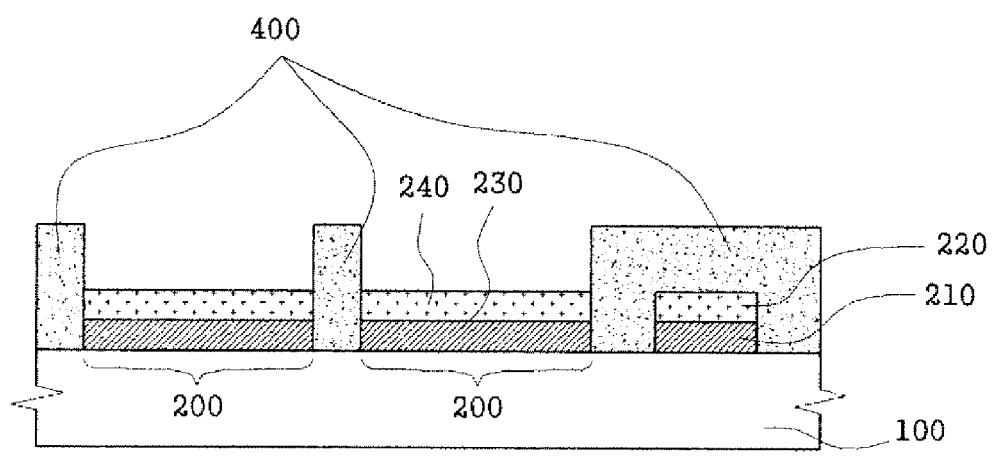

Referring to FIG. 3, a molybdenum silicon nitride (MoSiON) layer 230 is redeposited on the transparent substrate 100 exposed by the pattern of the resist layer 400 by partial sputtering. Referring to FIG. 4A, a chromium (Cr) layer 240 is redeposited on the molybdenum silicon nitride (MoSiON)

layer 230 exposed by the pattern of the resist layer 400. This is illustrated in FIG. 4B, a cross sectional view analogous to FIG. 2B.

Figure 5:
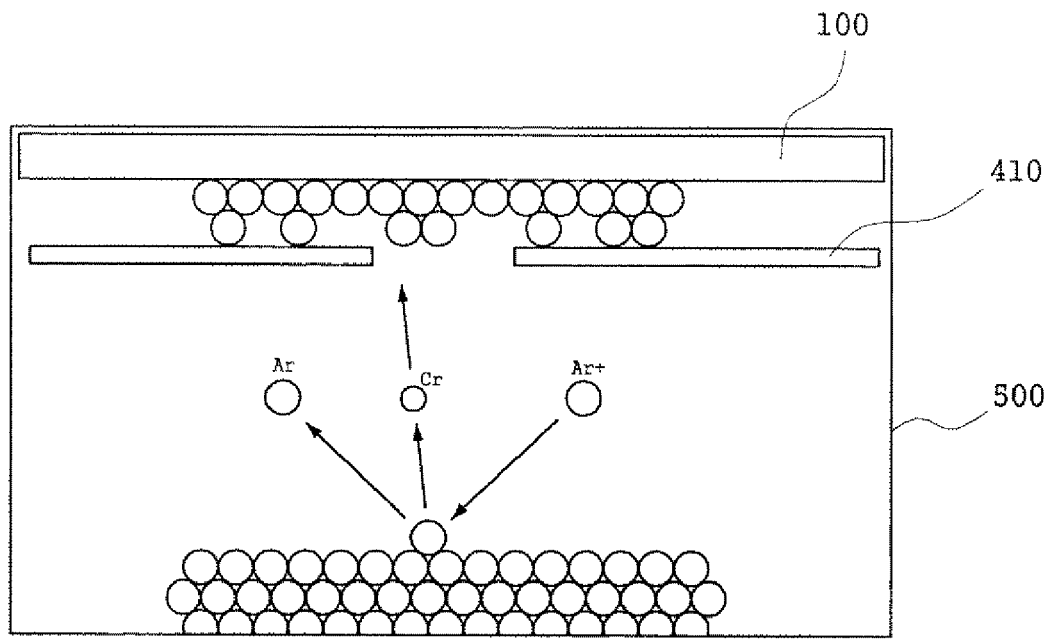

FIG. 5 illustrates the partial sputtering process. The transparent substrate 100 is loaded into a chamber 500 of a sputtering device. Then, argon (Ar) gas is introduced into the chamber 500. A mask 410 for selectively exposing the transparent substrate 100 is formed on the transparent substrate 100. A chromium (Cr) target is sputtered in Ar plasma while rotating the transparent substrate 100, thereby forming the chromium (Cr) layer 240 on the exposed transparent substrate 100.

Figure 6:
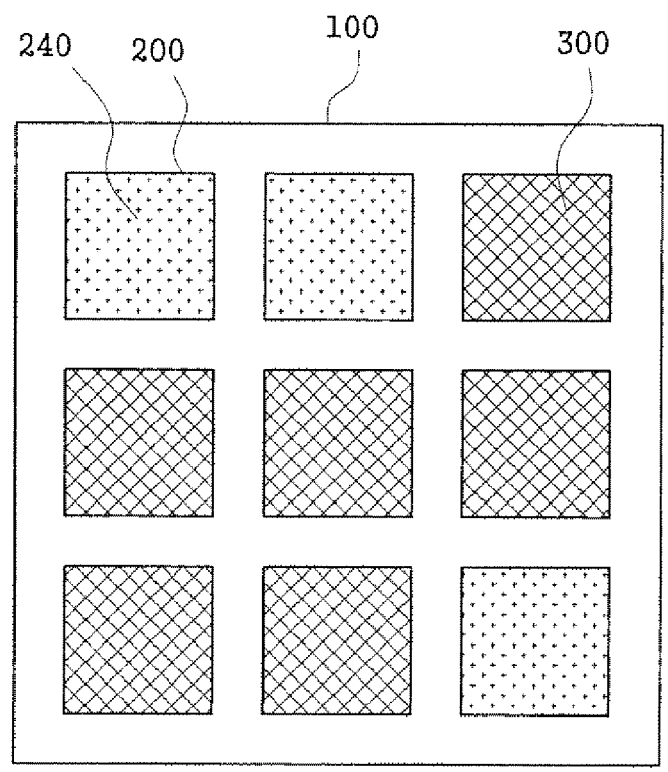

Referring to FIG. 6, the resist layer pattern 400 exposing the defect dies 200 is removed. The resist layer may be removed in, for example, oxygen plasma during an ashing process, thereby exposing the normal dies 300 in which normal patterns are formed on the transparent substrate 100 and the chromium (Cr) layer 240 redeposited on the defect dies 200. Before the chromium (Cr) layer pattern 240 is formed on the transparent substrate 100, the align key may be formed on the transparent substrate 100 for exact patterning.

Figure 7:
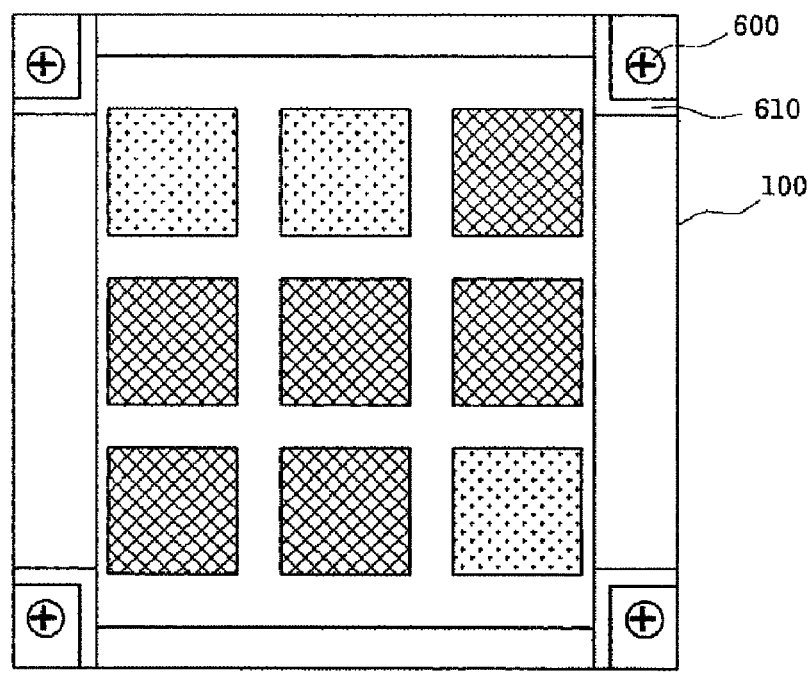

Meanwhile, when a mask layer is coated for the following patterning process, the mask layer may be also coated on a region in which the align key is formed. In this case, the align key would be undesirably obscured in the subsequent patterning step. Thus, as shown in FIG. 7, blocking bars 610 are formed to protect align keys 600 disposed at a specified region, for example, the corners of the transparent substrate 100. The blocking bars 610 serve to protect the align keys 600 for exactly aligning the redeposited molybdenum silicon nitride (MoSiON) layer 230 and chromium (Cr) layer 240 when the mask layer is coated. For example, each blocking bar 610 may be formed of plastic in a bar shape having a height of about 5 mm around each align key 600 on the transparent substrate 100.

Figure 8:
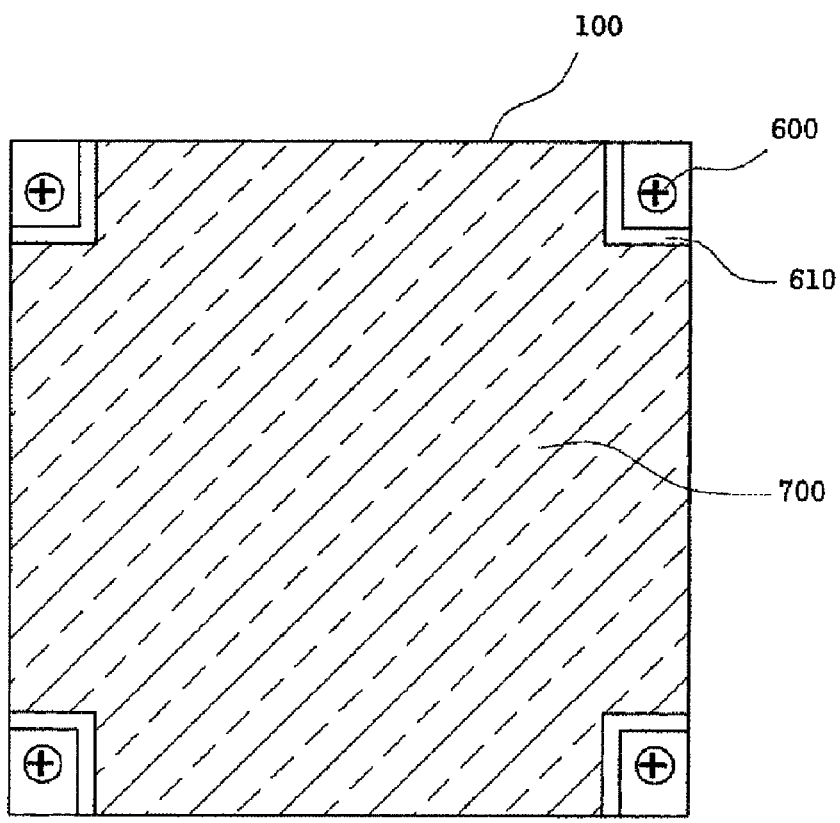

Referring to FIG. 8, a mask layer 700 is coated over the entire surface of the transparent substrate 100 using a spin coating method. In this case, the blocking bars 610 formed around the align keys 600 can prevent the align keys 600 from being coated with the mask layer 700.

Figure 9A:
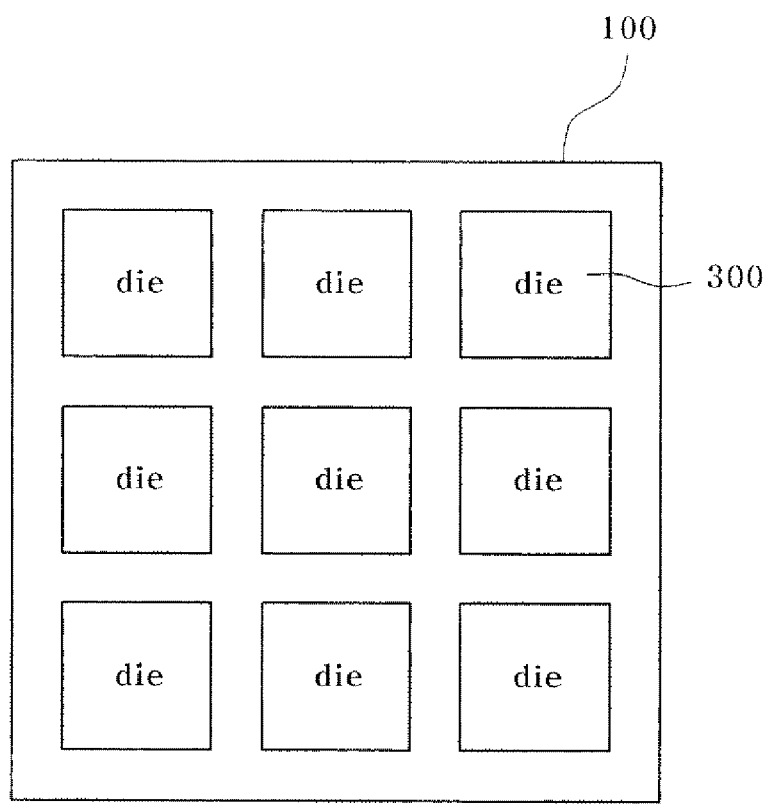
Figure 9B:
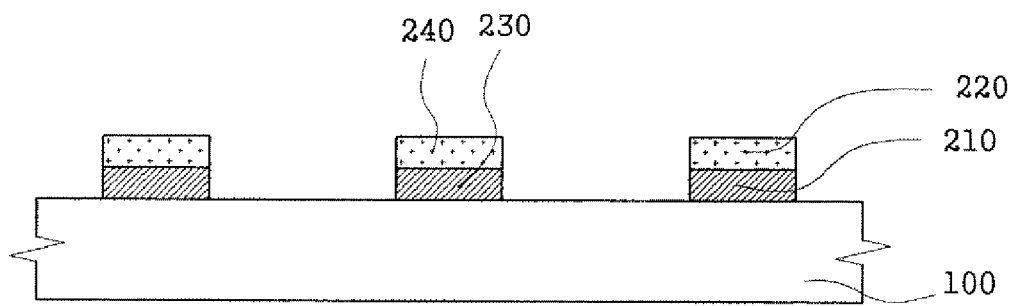

Referring to FIG. 9A, a mask layer pattern is formed by performing the exposure process using the electron beam (e-beam) and the development process. A normal pattern 300 is formed by patterning the molybdenum silicon nitride (MoSiON) layer 230 and the chromium (Cr) layer 240 formed on the defect dies 200, and the mask layer 700 is removed. In the exposure process using the e-beam, the pattern may be formed at an exact position without being tilted based on the align keys. This is illustrated in FIG. 9B, a cross sectional view analogous to FIG. 2B. As shown in FIG. 9B, the molybdenum silicon nitride (MoSiON) layer 230 and the chromium (Cr) layer 240 formed on the defect dies 200 are patterned using the align keys 600 as a reference, thereby forming the same pattern as that formed on the normal dies 300.

Although preferred embodiments of the invention have been disclosed for illustrative purposes, those skilled in the art will appreciate that various modifications, additions and substitutions are possible, without departing from the scope and spirit of the invention as defined in the accompanying claims.

What is claimed is:

1. A method for repairing photomask pattern defects comprising:

forming first patterns over a transparent substrate;

detecting a defect die including a first defect pattern by inspecting the first patterns;

forming a mask pattern that selectively exposes the defect die over the transparent substrate;

removing the first defect pattern of the defect die using the mask pattern as an etching mask;

forming a material layer for forming a second pattern over the defect die of the transparent substrate;

removing the mask pattern; and forming the second pattern on the defect die by patterning the material layer.

2. The method according to claim 1, wherein forming the second pattern comprises:

forming a resist layer over the transparent substrate where the mask pattern is removed;

exposing and developing the resist layer, thereby forming a resist layer pattern; and patterning the material layer using the resist layer pattern as an etching mask.

3. The method according to claim 2, wherein patterning the material layer comprises using an align key formed over the transparent substrate.

4. The method according to claim 3, further comprising:

forming a blocking pattern around the align key before forming the resist layer.

5. The method according to claim 4, comprising forming the blocking pattern to a height sufficient to prevent the resist payer from being formed over the align key.

6. The method according to claim 5, wherein the blocking pattern is formed to a height of about 5 mm.

7. The method of claim 1, wherein the first patterns and the second pattern comprise a light blocking layer pattern.

8. The method of claim 7, wherein the first patterns and second pattern further comprise a phase shift layer pattern.

9. The method according to claim 7, wherein the light blocking layer pattern comprises a chromium (Cr) layer pattern.

10. The method according to claim 8, wherein the phase shift layer pattern comprises a molybdenum silicon nitride (MoSiON) layer pattern.

11. The method according to claim 1, wherein forming the material layer comprises using a sputtering method.

12. A method for repairing photomask pattern defects comprising:

patterning a target layer over a transparent substrate, thereby forming first patterns;

detecting a defect region including a defect pattern by inspecting the first patterns;

selectively etching the first pattern in the defect region using a mask pattern that selectively exposes the defect region;

depositing a second target layer on the defect region; and patterning the second target layer, thereby forming a second pattern on the defect region.

13. The method according to claim 12, wherein patterning the second target layer comprises:

forming a resist layer over the transparent substrate including the deposited second target layer;

exposing and developing the resist layer, thereby forming a resist layer pattern; and patterning the second target layer using the resist layer pattern as an etching mask, thereby forming the second pattern.

* * * * *